73-632 SR
7/7/81 XR 4,277,712

United States Patent [19] [11] 4,277,712
Hanafy [45] Jul. 7, 1981

[54] ACOUSTIC ELECTRIC TRANSDUCER WITH SLOTTED BASE

[75] Inventor: Amin M. Hanafy, Andover, Mass.

[73] Assignee: Hewlett-Packard Company, Palo Alto, Calif.

[21] Appl. No.: 83,693

[22] Filed: Oct. 11, 1979

[51] Int. Cl.³ .............................................. H01L 41/08

[52] U.S. Cl. ...................................... 310/334; 310/336; 128/660; 73/632

[58] Field of Search ............... 310/334, 335, 336, 337, 310/327; 73/632, 642, 644; 128/660

[56] References Cited

U.S. PATENT DOCUMENTS

| | | | |
|---|---|---|---|
| 2,844,809 | 7/1958 | Batchelder | 310/337 X |
| 3,698,051 | 10/1972 | Miller | 310/336 X |
| 3,851,300 | 11/1974 | Cook | 310/334 X |
| 4,101,795 | 7/1978 | Fukumoto et al. | 310/336 |
| 4,211,948 | 7/1980 | Smith et al. | 310/334 X |
| 4,217,516 | 8/1980 | Iinuma et al. | 310/335 |
| 4,217,684 | 8/1980 | Brisken et al. | 310/334 X |

*Primary Examiner*—Mark O. Budd
*Attorney, Agent, or Firm*—Donald N. Timbie

[57] ABSTRACT

The rate of decay of oscillations caused by application of driving pulses to the spaced crystals of an acoustic electric transducer that are mounted on a base is increased by provision of slots in the base so as to attenuate Rayleigh waves flowing in the surface thereof that can induce crystal oscillation in the thickness mode by mode conversion.

4 Claims, 8 Drawing Figures

PRIOR ART *Fig. 1A*

ACOUSTIC ELECTRIC TRANSDUCER WITH SLOTTED BASE

BACKGROUND OF THE INVENTION

This invention relates to an improvement in electro-acoustic transducers that are used in instruments for forming images of an interior portion of the body of a patient from reflections of energy contained in pulses of acoustic waves of a carrier frequency $F_C$ transmitted into the body. Such transducers are commonly comprised of a plurality of rectilinear piezoelectric crystals mounted in spaced parallel relationship on the surface of an energy absorbing base. The pulses of acoustic waves are generated by applying driving pulses of voltage to the crystals so as to cause them to oscillate in a direction perpendicular to the base in what is known as the "thickness mode," and the image is formed in response to electrical signals produced by similar oscillations caused by the acoustic waves reflected to the crystals from a point in the body. Because the carotid artery or the heart of a baby are very close to the surface of the body, the formation of their images requires a system having a very small minimum range. Unfortunately, however, transducers constructed as briefly described above cause the minimum range to be much greater than desired. This is because of the slow decay in the large amplitude oscillations created in the crystals during the generation of each transmitted pulse, for as long as the amplitude of the oscillations is too large, it masks the relatively weak oscillations produced in the crystals by reflected acoustic pulses.

The driving pulses applied to a crystal also cause it to oscillate in a length mode. This oscillation is at a lower frequency $F_R$ than the carrier frequency $F_C$ and produces what is known as "Rayleigh" wave that travels along the surface of the base in opposite directions from the crystal. As the Rayleigh wave passes by the other crystals, it induces them to continue oscillating in the thickness mode at the frequency $F_C$ by mode conversion. Because of its low frequency, the Rayleigh wave is only slightly attenuated as it moves along the surface of the base so that the amplitude of the thickness mode oscillations induced in the crystals is fairly high. Furthermore, the Rayleigh wave travels along the surface of the base at a slow rate so that considerable time elapses before it reaches the crystal that is farthest away. The thickness mode oscillations induced by the Rayleigh waves produce other Rayleigh waves so that considerable time elapses before the amplitude of the resulting thickness mode oscillations gradually reduces to zero. During a portion of this time, the crystals oscillate in the thickness mode with such amplitude as to produce electrical signals that saturate the amplifiers and mask any desired signals that may be produced by reflected acoustic waves.

BRIEF DISCUSSION OF THE INVENTION

In accordance with this invention, the Rayleigh waves are greatly attenuated by providing slots in the base in alignment with the spaces between the parallel crystals.

BRIEF DESCRIPTION OF THE DRAWINGS

FIG. 1A is an elevation of FIG. 1 illustrating by cross-sectioning the construction of a transducer of the prior art;

DETAILED DESCRIPTION OF THE DRAWINGS

Figure 1:
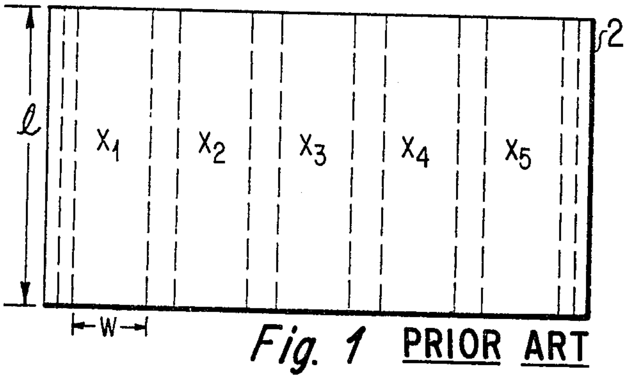
Fig. 1 PRIOR ART
FIG. 1 is a top view of a transducer of the prior art and is the same as a top view of a transducer incorporating the invention.

FIG. 1 is a top view of a thin metal shield 2 that is used with transducers of the prior art as well as with transducers incorporating this invention wherein the dashed lines indicate a plurality of crystals $X_{1-5}$ in contact with the underside of the shield 2. In FIG. 1A, which is an elevation of FIG. 1, it is seen that the tops of the crystals $X_{1-5}$ are in electrical contact with the underside of the shield 2 and that the bottoms are respectively in electrical contact with metal strips $s_{1-5}$ that are in turn attached to a coating 4 of insulating material such as $AL_2O_3$ on a base 5. Thus, the crystals $X_{1-5}$ are effectively mounted on the base 5. The function of the base 5 is to provide an acoustical impedance match with the insulating layer 4, the strips $s_{1-5}$ and the crystals $X_{1-5}$ and to absorb acoustical energy resulting from oscillation of the crystals $X_{1-5}$. Materials meeting this criteria are generally conductive so that the base 5 would short circuit the strips $s_{1-5}$ if it were not for the insulating coating 4. Each of the crystals $X_{1-5}$ has a height h, a width w and a length l, and they are mounted with their lengths parallel and spaced from each other. In the interest of clarity of illustration, the number of crystals shown is far less than are usually used, and their dimensions are exaggerated. By way of example, as many as 64 crystals have been used having a length l of one centimeter, a height h of 0.05 cm, a width w of 0.02 cm, and a spacing between the longitudinal centers of the crystals might be 0.03 cm. Leads $L_{1-5}$ are respectively connected to the metal strips $s_{1-5}$ and are encased in a conductive sheath 6 that is connected to ground, as are the shield 2 and the base 5.

The acoustic pulse of thickness mode oscillation that is to be transmitted into a patient's body in contact with the grounded shield 2 is generated by applying pulses of a driving voltage to the leads $L_{1-5}$. Although the pulses of driving voltage may have various forms, it is customary to employ one cycle of a carrier frequency $F_C$ at which the crystals resonate in the thickness mode. The bandwidth of the crystals is such that they produce several strong cycles of the frequency $F_C$ that are radiated into the body.

Oscillation of the crystals in the thickness mode causes vibrations of the frequency $F_C$ in the base 5. The vertical component of the vibrations travels downward into the base 5 and is absorbed. The horizontal component travels along the surface of the base 5 in opposite directions from the crystal, but it is so severely attenuated as to have little effect.

The frequency spectrum of the driving pulse and the bandwidth of the crystals overlap so that each crystal oscillates in both its width mode and its length mode by mode conversion. Vibrations produced by the width mode oscillations are at a frequency $F_W$ that is much higher than the carrier frequency $F_C$ in most designs so that it is severely attenuated in the base 5. Furthermore, $F_W$ generally lies outside of the response of the system so as to cause no problem. Because the length l of the crystals is generally much greater than their other dimensions, the oscillations in the length or transverse mode are at a frequency $F_l$ that is much lower than the frequency $F_C$. An harmonic of $F_l$, which is $F_R$, lies within the response of the crystal system. The vibrations $F_R$ produced by each crystal in the base 5 travel outwardly at a low velocity along the surface of the base 5, as indicated by the arrows 8 and 10, without significant attenuation. These vibrations are known as Rayleigh waves, and as they pass by the bottoms of the other crystals, they induce them to oscillate in their thickness mode at the frequency $F_C$ by mode conversion. The velocity of the Rayleigh wave along the surface of the base 5 may be about $0.8\times10^5$ cm/sec so that after the last driving pulse is applied, it may take 31 microseconds for the Rayleigh wave to travel to the most remote transducer of an array having 64 crystals of the dimensions set forth. Each transducer creates Rayleigh wave in response to the thickness mode oscillations induced in them by other Rayleigh waves so that, as indicated by the graph 12 in FIG. 2, it may take as long as 104 microseconds for the thickness mode oscillations in the crystals to decay by 100 db.

Figure 2:
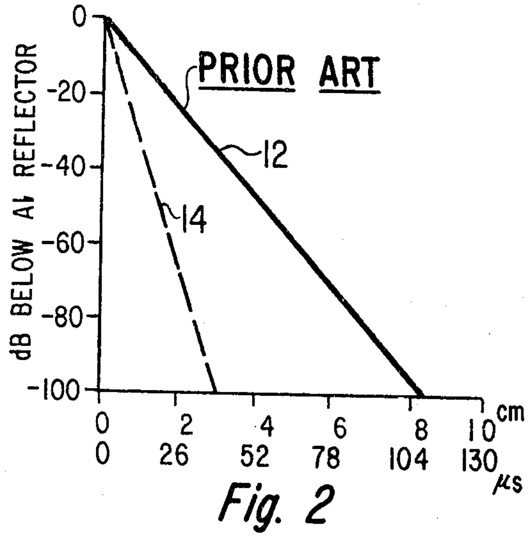
FIG. 2 is a graph respectively illustrating the rates of decay in the Rayleigh wave energy relative to the total energy of a transmitted acoustic pulse reflected by an aluminum reflector for a transducer constructed in accordance with the prior art and a transducer using the slotted base of this invention.
Figure 3:
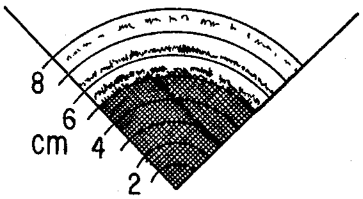
FIG. 3 illustrates an image produced with a transducer of the prior art.

If the sensitivity of the reception system including the transducer of FIG. 1A is such as to respond to signals that are no more than 20 db below the strength of a transmitted acoustic pulse that is reflected from a perfect reflector, the energy of the thickness mode oscillations of the crystals will, as seen from graph 12 of FIG. 2, decay to this level in about 25 microseconds during which time a transmitted pulse will pass through the body of a patient to a range of 1.75 cm and back. Inasmuch as the energy in the pulses actually received by the transducer as a result of reflection from the body tissue are far weaker than the energy in a fully reflected pulse, they will be masked for a greater range, such as 5 cm, as illustrated in FIG. 3.

PREFERRED EMBODIMENT

Figure 4:
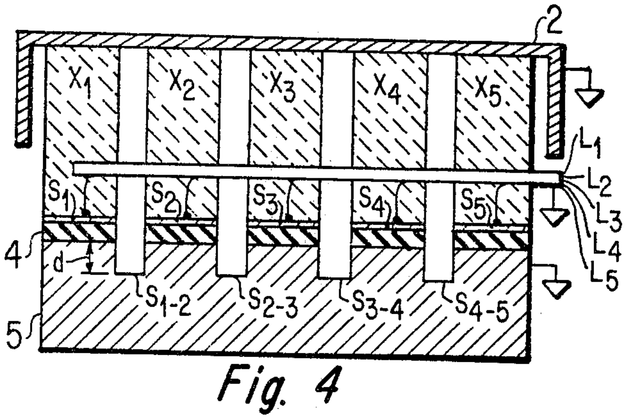
FIG. 4 is an elevation of FIG. 1 in which cross-sectioning is used to illustrate a transducer constructed in accordance with this invention.

Reference is now made to FIG. 4 which illustrates a transducer constructed in accordance with the invention. It differs from the prior art construction of FIG. 1A in that slots $S_{1\text{-}2}$, $S_{2\text{-}3}$, $S_{3\text{-}4}$ and $S_{4\text{-}5}$ are formed in the base 5 in alignment with the spaces between the crystals $X_{1\text{-}5}$ respectively. As the depth d of these slots is increased, the amplitude of the Rayleigh wave compared to its maximum value gradually decreases in accordance with an expression $$\exp - dB_l\left[1 - \frac{.87 + 1.1\mu}{(1-\mu)\sqrt{2(1+\mu)}}\right]^{\frac{1}{2}}$$

where $\mu$ is Poisson's ratio and $B_l = 2\pi/\lambda_l$, $\lambda_l$ being the wavelength of the Aryleigh wave in the base 5, and d is the depth of cut.

Figure 5:
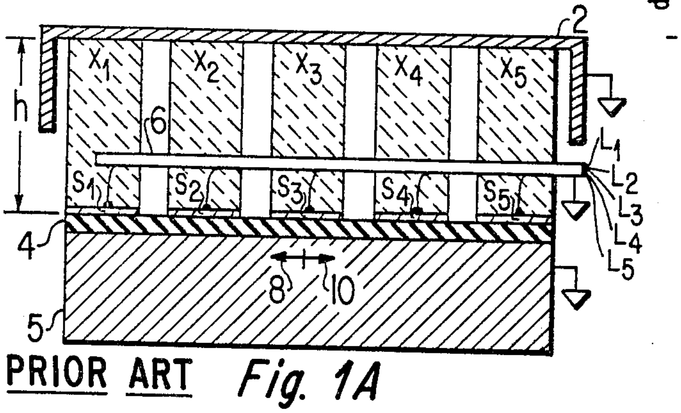
FIG. 5 is a graph illustrating the variation in the attenuation of the Rayleigh wave with the ratio of the depth d of the slots in the base to the wavelength $\lambda_R$ of the wave in the base.
Figure 5:
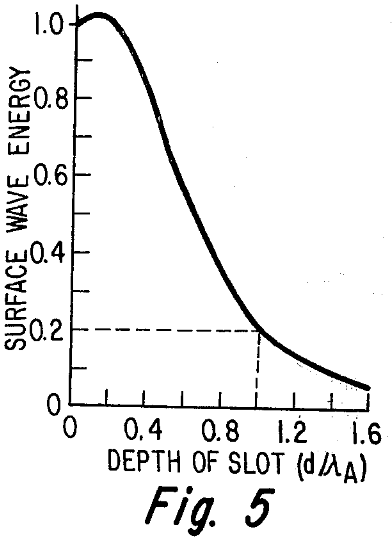
Figure 6:
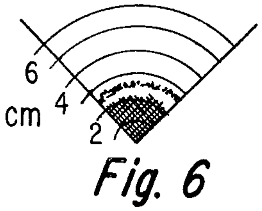
FIG. 6 illustrates an image formed with a transducer containing the invention.

FIG. 5 is a plot of the reduction in surface wave energy at a frequency $F_R$ as a function of the depth of the slots. If the depth of a slot one wavelength, $\lambda_l$, it can be seen from FIG. 5 that the surface wave energy of the Rayleigh wave $F_R$ is reduced by the slots to about 0.2 of its former value at any point along the surface, as indicated by the graph 12 of FIG. 2. The thickness mode oscillations of the crystals decay in a similar manner. If, as previously noted, the system sensitivity is such as to respond to signals that are no greater than 20 db below the strength of the transmitted acoustic pulse that is reflected from a perfect reflector, the oscillations in the crystals at the frequency $F_C$ will, in accordance with FIG. 2, decay to this level in about 8 microseconds. During this time a transmitted pulse will pass through the body of a patient to a range of about 0.6 cm and back. The range within which the oscillations induced by the Rayleigh wave mask the weaker reflections from desired targets is reduced to about 2 cm in the image of FIG. 6.

Figure 7:
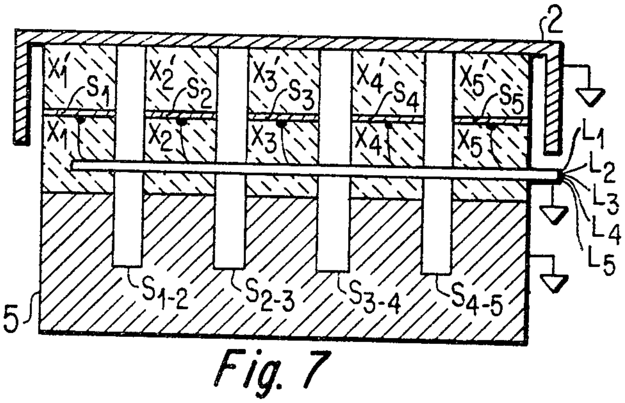
FIG. 7 is an elevation of FIG. 1 illustrating the slotted base of this invention in combination with a stacked crystal construction set forth in a U.S. patent application, Ser. No. 020,007, filed on Mar. 12, 1979, in the name of John D. Larson III, and entitled "Apparatus and Method for Suppressing Mass/Spring Mode in Acoustic Imaging Transducers."

FIG. 7 illustrates the application of this invention to a transducer having a dual crystal construction. Each crystal is divided into respective upper and lower portions $X_1$, $X_1'$; $X_2$, $X_2'$; $X_3$, $X_3'$; $X_4$, $X_4'$ and $X_5$, $X_5'$ by the strips $s_{1\text{-}5}$, and the leads $L_{1\text{-}5}$ are respectively connected to the strips $s_{1\text{-}5}$. The slots $S_{1\text{-}2}$, $S_{2\text{-}3}$, $S_{3\text{-}4}$ and $S_{4\text{-}5}$ are in alignment with the spaces between the crystals $X_{1\text{-}5}$ respectively. But because the strips $s_{1\text{-}5}$ to which the driving pulses are applied are between the crystals $X_1$ and $X_1'$, etc., the outer ends can be grounded so that the insulating coating 4 can be eliminated.

As shown in FIGS. 4 and 7, the slots $S_{1\text{-}2}$, $S_{2\text{-}3}$, $S_{3\text{-}4}$ and $S_{4\text{-}5}$ have the same width as the corresponding spaces between the crystals because it is easy to cut them when the block of crystal material is sliced to form the separate crystals by slicing into the base 5, but other widths could be used.

What is claimed is:

1. A transducer for translating electrical signals into acoustic signals and vice-versa, comprising a base, a plurality of rectilinear piezoelectric crystals mounted on said base in parallel, there being a space between each crystal and an adjacent one, means for selectively applying electrical fields to said crystals so as to make them produce acoustic waves in a direction away from said base, and means defining slots in the surface of said base on which the crystals are mounted, the said slots being respectively aligned with the spaces between said crystals so as to attenuate a Rayleigh wave emanating from each crystal along the surface of said base on which the crystals are mounted.

2. A transducer as set forth in claim 1 wherein the depth of said slots below the surface on which the crystals are mounted is about equal to the wavelength of the Rayleigh wave that would exist along the said surface of the said base if the slots were not present.

3. A transducer as set forth in claim 1 wherein said means for selectively applying electrical fields to said crystals is comprised of a shield of electrically conductive material mounted in contact with the tops of said crystals and electrically separate conductive strips respectively mounted between the bottom of each crystal and said base.

4. A transducer as set forth in claim 1 wherein said means for selectively applying electrical fields to said crystals is comprised of electrically conductive shield means mounted in contact with the tops of said crystals, electrically conductive means mounted between the bottoms of said crystals and said base, and electrically conductive strips mounted between the bottoms and tops of each of said crystals so as to divide the crystals into a plurality of parts.

* * * * *